United States Patent
Tanaka (10) Patent No.: US 7,410,837 B2
(45) Date of Patent: Aug. 12, 2008

(54) METHOD OF MANUFACTURING MOUNTING SUBSTRATE

(75) Inventor: Koichi Tanaka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/610,244

(22) Filed: Dec. 13, 2006

(65) Prior Publication Data

US 2007/0141758 A1    Jun. 21, 2007

(30) Foreign Application Priority Data

Dec. 16, 2005    (JP)    ............................ 2005-363411

(51) Int. Cl.
  H05K 7/06    (2006.01)
  H05K 1/11    (2006.01)
  H01L 21/00    (2006.01)
(52) U.S. Cl. ................... 438/125; 361/760; 174/260; 174/262; 438/14; 438/17; 257/48; 257/700; 257/E21.505

(58) Field of Classification Search ................. 438/125, 438/15, 18; 361/718, 763; 257/E21.499, 257/E21.505, 44, 48, 698, 700, E21.575, 257/E21.627, E21.641; 428/14
See application file for complete search history.

(56) References Cited

U.S. PATENT DOCUMENTS

| | | | |
|---|---|---|---|
| 2005/0088833 A1* | 4/2005 | Kikuchi et al. | 361/763 |
| 2005/0211465 A1* | 9/2005 | Sunohara et al. | 174/260 |
| 2005/0252682 A1* | 11/2005 | Shimoto et al. | 174/260 |

FOREIGN PATENT DOCUMENTS

JP    11-112152    4/1999

* cited by examiner

*Primary Examiner*—Brook Kebede
*Assistant Examiner*—Shaka Scarlett
(74) *Attorney, Agent, or Firm*—Rankin, Hill & Clark LLP (57) ABSTRACT

A method for manufacturing a mounting substrate on which a semiconductor chip is mounted includes: forming a wiring section by electrolytic plating on a first face of a supporting substrate which is made of an insulating material, by supplying electric power from a first power supply layer through a via plug piercing through the supporting substrate, the first power supply layer being formed on a second face of the supporting substrate; performig patterning on the first power supply layer so as to form a first conductive pattern which is connected to the wiring section through the via plug; performing a connection test of the wiring section by using the conductive pattern; mounting the semiconductor chip on the wiring section; and removing the supporting substrate.

8 Claims, 12 Drawing Sheets

METHOD OF MANUFACTURING MOUNTING SUBSTRATE

This application claims foreign priority based on Japanese Patent application No. 2005-363411, filed Dec. 16, 2005, the content of which is incorporated herein by reference in its entirety.

BACKGROUND OF THE INVENTION

1. Field of the Invention

The present invention relates to a method for manufacturing a mounting substrate on which a semiconductor chip is mounted.

2. Description of the Related Art

Presently, electronic devices using semiconductor devices such as semiconductor chips have been manufactured in high performance. Under such a circumstance, semiconductor-chips are required to be mounted on substrates in high density, and substrates on which semiconductor chips are mounted are required to be made compact and also required to save spaces.

Various types of methods for mounting semiconductor chips have been proposed, for instance, methods for mounting semiconductor chips in flip-chip manners have been proposed (referto, for example, JP-A-11-112152). While such a flip-chip mounting technique is utilized, mounting substrates in which semiconductor chips are embedded may be furthermore constructed.

However, in a case where mounting substrates on which semiconductor chips have been mounted are manufactured, there are some possibilities that below-mentioned manufacturing problems may occur.

Figure 1A:
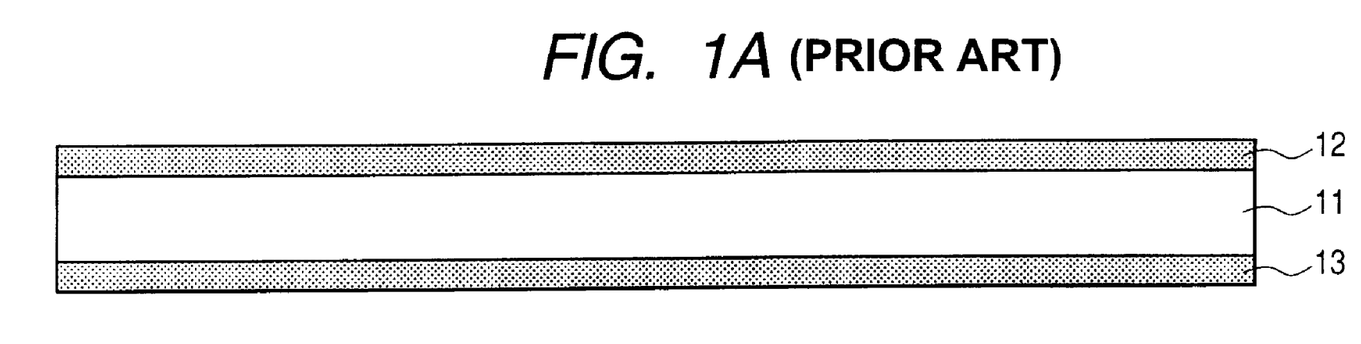
FIG. 1A is a diagram for showing an example of a manufacturing method of a mounting substrate (No. 1).
Figure 1B:
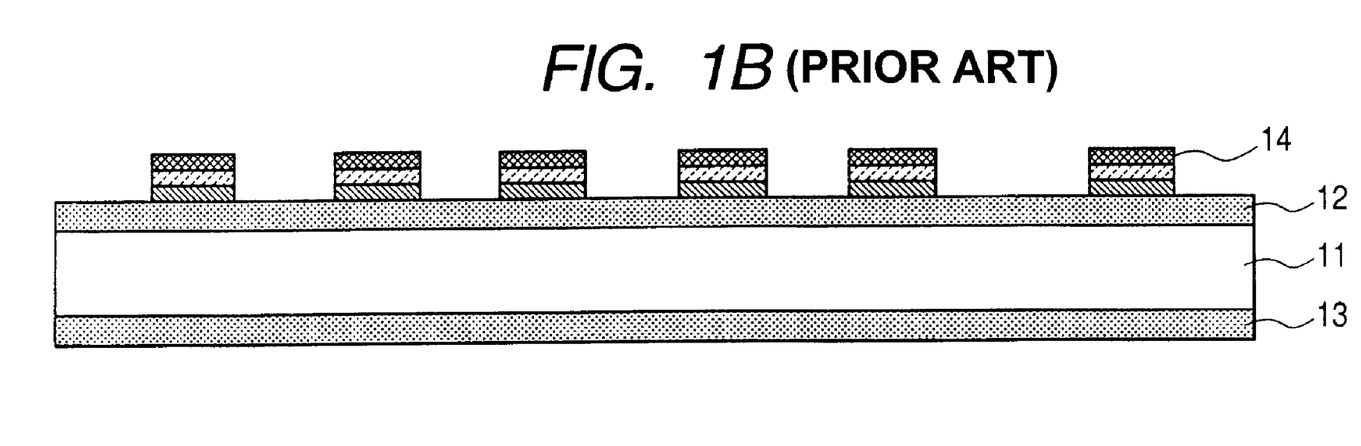
FIG. 1B is a diagram for showing an example of a manufacturing method of a mounting substrate (No. 2).
Figure 1C:
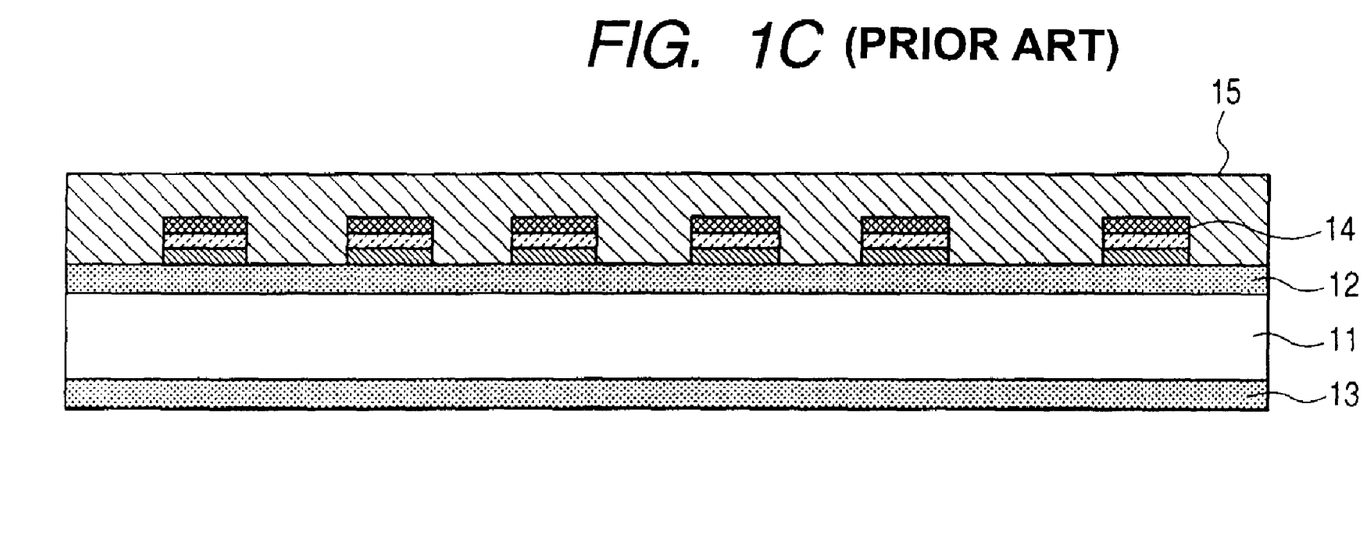
FIG. 1C is a diagram for showing an example of a manufacturing method of a mounting substrate (No. 3).

FIG. 1A to FIG. 1C are diagrams for showing one example of sequential operations for manufacturing a mounting substrate on which a semiconductor chip is mounted.

First, in a step shown in FIG. 1A, a supporting substrate is prepared having conductive layers (for instance, copper foils, etc.) 12 and 13 formed on both faces of a core substrate 11. The core substrate 11 is made of, for example, a prepreg material.

Next, in a step as shown in FIG. 1B, a patterned connecting layer 14 is formed on the above-explained conductive layer 12, by electrolytic plating while using the conductive layer 12 as a power supply path. The connecting layer 14 is made of Au/Ni/Cu.

Next, in a step as shown in FIG. 1C, an insulating layer (build-up layer) 15 is formed on the conductive layer 12 in such a manner that the insulating layer 15 covers the connecting layer 14. In the below-mentioned steps, while the conductive layer 12 and the connecting layer 14 are used as a power supply path, via plugs and pattern wiring are formed on the connecting layer 14 by electrolytic plating so as to form a wiring section, and then the semiconductor chip is mounted on the wiring section, for example.

However, in the above-described configuration, under such a condition that the respective wiring sections on which a semiconductor chip is to be mounted are electrically connected to each other by the conductive layer 12, the semiconductor chip is mounted on these wiring sections. As a result, there is such a problem that connection tests (Short/Open Test, will be sometime referred to as "SOT") for the individual wiring sections can be hardly carried out.

For example, in the above-explained case, the connection test of the wiring sections is carried out after the semiconductor chip is mounted and thereafter the supporting substrate is removed. As a consequence, a malfunction of a circuit (wiring) is detected after the semiconductor chip is mounted on the mounting substrate, and then the high cost semiconductor c-hip is mounted on the mounting substrate having malfunction. In this case, such a problem may occur that the semiconductor chip has to be disposed. Accordingly, there is a risk that the manufacturing cost is increased.

SUMMARY OF THE INVENTION

The present invention has been made in view of the above circumstances, and provides a method for manufacturing a mounting substrate, which is novel and useful.

The present invention provides a method for manufacturing a mounting substrate in a good yield, on which a semiconductor chip is mounted and in which a wiring section connected to the semiconductor chip has high reliability.

In some implementations, a method of the invention for manufacturing a mounting substrate on which a semiconductor chip is mounted, the method comprising:

forming a wiring section by electrolytic plating on a first face of a supporting substrate which is made of an insulating material, by supplying electric power from a first power supply layer through a via plug piercing through the supporting substrate, the first power supply layer being formed on a second face of the supporting substrate;

performing patterning on the first power supply layer so as to form a first conductive pattern which is connected to the wiring section through the via plug;

performing a-connection test of the wiring section by using the conductive pattern;

mounting the semiconductor chip on the wiring section; and removing the supporting substrate.

Accordingly, a mounting substrate on which a semiconductor chip mounted and in which a wiring section connected to the semiconductor chip has high reliability can be manufactured in a good yield.

The method for manufacturing the mounting substrate, further comprising:

forming a second conductive pattern on the first face of the supporting substrate, the second conductive pattern and the via plug serving as a power supply path for electrolytic plating; and removing the second conductive pattern after removing the supporting substrate.

Then, a power supply path for forming the wiring section can be made easily.

The method for manufacturing the mounting substrate as claimed in claim 1, further comprising:

forming a second power supply layer on the second face of the supporting substrate after mounting the semiconductor chip; and forming an upper layer wiring section on the wiring section by electrolytic plating, by supplying electric power from the second power supply layer, wherein the supporting substrate is removed after forming the upper layer wiring section.

Then, such a mounting substrate having a multilayer wiring structure and in which a wiring section has high reliability can be manufactured in a good yield.

The method for manufacturing the mounting substrate, further comprising:

forming a first insulating layer on the first face; and forming a second insulating layer on the first insulating layer, wherein the wiring section is formed on the first insulating layer, and the upper layer wiring section is formed on the second insulating layer.

Then, such a mounting substrate having a multilayer wiring structure and in which a wiring section has high reliability can be manufactured in a good yield.

In the method for manufacturing the mounting substrate, the supporting substrate is removed by grinding. Then, the supporting substrate can be easily removed.

Accordingly, a mounting substrate on which a semiconductor chip is mounted and in which a wiring section connected to the semiconductor chip has high reliability can be manufactured in a good yield.

DESCRIPTION OF THE PREFERRED EMBODIMENTS

In the present invention, a method for manufacturing a mounting substrate on which a semiconductor chip is mounted comprises: 1) forming a wiring section by electrolytic plating on a first face of a supporting substrate which is made of an insulating material, by supplying electric power from a first power supply layer through a via plug piercing through the supporting substrate, the first power supply layer being formed on a second face of the supporting substrate; 2) performing patterning on the first power supply layer so as to form a first conductive pattern which is connected to the wiring section through the via plug; 3) performing a connection test of the wiring section by using the conductive pattern; 4) mounting the semiconductor chip on the wiring section; and 5) removing the supporting substrate.

In the mounting substrate manufacturing method of the related art, after the wiring sections to which the semiconductor chip is connected are formed by electrolytic plating, the semiconductor chip is mounted on the mounting substrate under such a condition that the respective wiring sections are electrically connected to each other by the power supply layer used for electrolytic plating. As a result, there are such problems that the connection test for the individual wiring sections can be hardly carried out before the semiconductor chip is mounted, and the high cost semiconductor chip is necessarily mounted on the mounting substrate having the connection malfunction of the wiring sections.

On the other hand, in the method of manufacturing the mounting substrate according to an embodiment of the present invention, the connection test (SOT) of the wiring sections can be carried out before the semiconductor chip is mounted. As a result, the mounting substrate where reliability of the wiring sections to be connected to the semiconductor chip becomes high can be manufactured in a good yield. Also, it is possible to suppress such a probability that a manufacturing problem occurs, namely, the semiconductor chip is mounted on the mounting substrate having the connection malfunction of the wiring sections.

Next, a description is made of one example as to a manufacturing method of the present invention with reference to drawings.

Embodiment 1

FIG. 2A to FIG. 2K are diagrams for showing sequential operations as to a method for manufacturing a mounting substrate according to an embodiment 1. It should be noted that the same reference numerals previously explained in the above drawings will be used as those for denoting same structural elements as shown in the below-mentioned drawings.

Figure 2A:
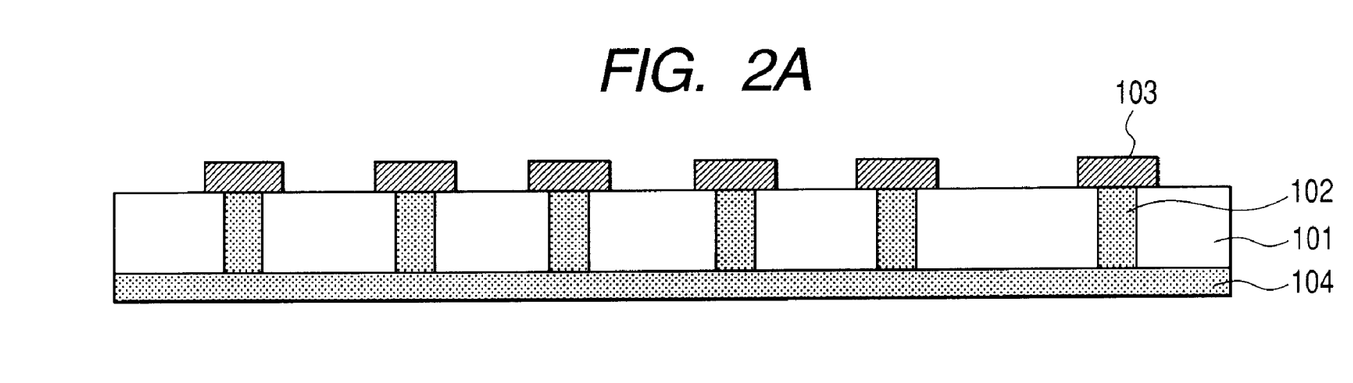
FIG. 2A is a diagram for showing a method for manufacturing a mounting substrate, according to an embodiment 1 (No. 1).

Firstly, in a step as shown in FIG. 2A, via plugs 102 are formed in a supporting substrate (core substrate) 101 which is made of an insulating material such as, for example, a prepreg material. The via plugs 102 pierce the supporting substrate 101. Also, conductive patterns 103 made of, for example, Cu (copper) is formed on a first face (namely, a face on which semiconductor chip is mounted in later step) of the supporting substrate 101. A conductive layer (power supply layer) 104 made of, for example, Cu is formed over an entire second face of the supporting substrate 102. The conductive patterns 103 are individually connected to the via plugs 102.

Alternatively, in the above-explained case, the above-described structure may be formed by using such a substrate that a copper foil is previously formed on the supporting substrate 101.

Figure 2B:
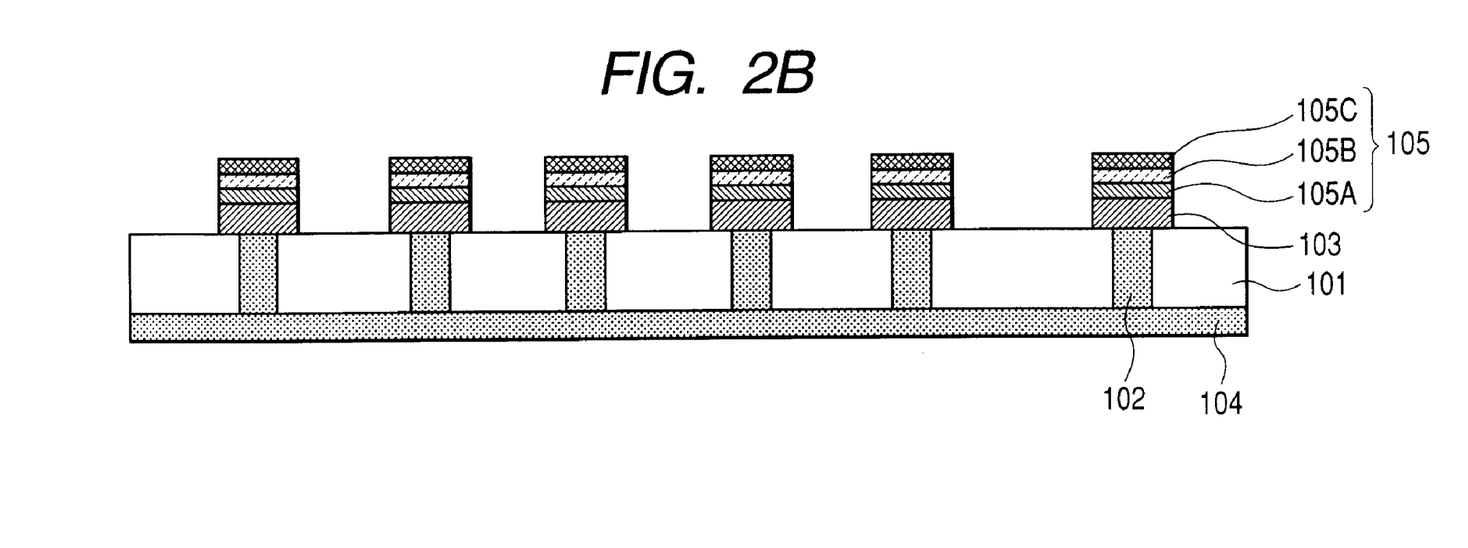
FIG. 2B is a diagram for showing a method for manufacturing a mounting substrate, according to an embodiment 1 (No. 2).

Next, in a step shown in FIG. 2B, a connecting layer 105 is formed on the conductive patterns 103 by performing electrolytic plating, while the above-described conductive layer (power supply layer) 104, the via plugs 102, and the conductive patterns 103 are used as a power supply path. The connecting layer 105 is formed by accumulating an Au layer 105A, an Ni layer 105B and a Cu layer 105C. This connecting layer 105 makes a good connection (close contact) between via plugs which are formed in a later step and an electric connecting section such as solder bumps.

Figure 2C:
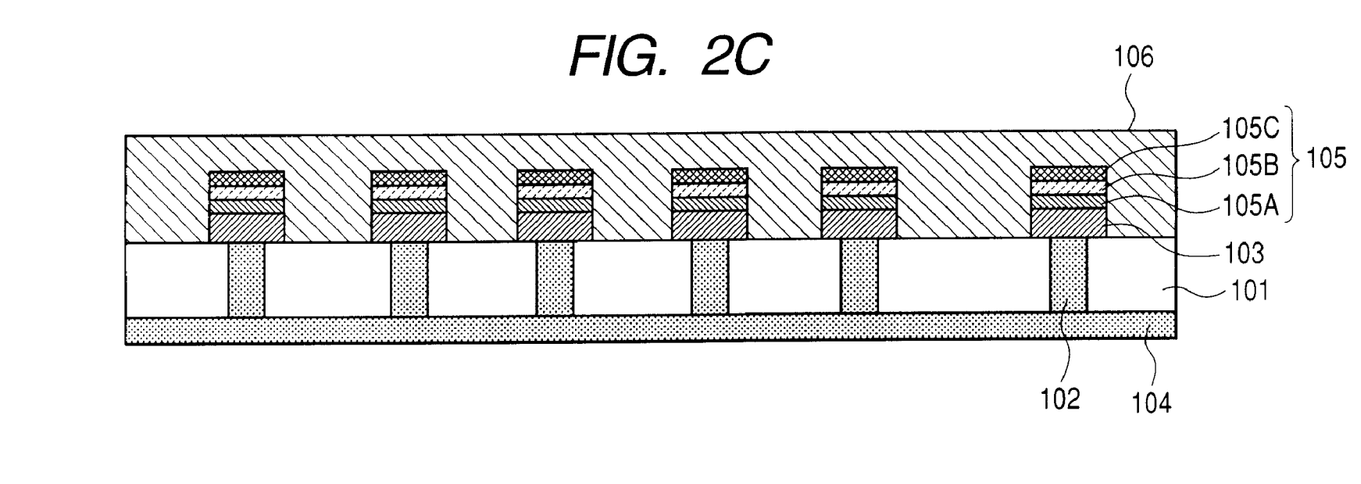
FIG. 2C is a diagram for showing a method for manufacturing a mounting substrate, according to an embodiment 1 (No. 3).

Next, in a step shown in FIG. 2C, an insulating layer 106 made of, for example, a build-up resin (either epoxy resin or polyimide resin, etc.) is formed on the first face of the supporting substrate 101 in such a manner that the insulating layer 106 covers the connecting layer 105.

Figure 2D:
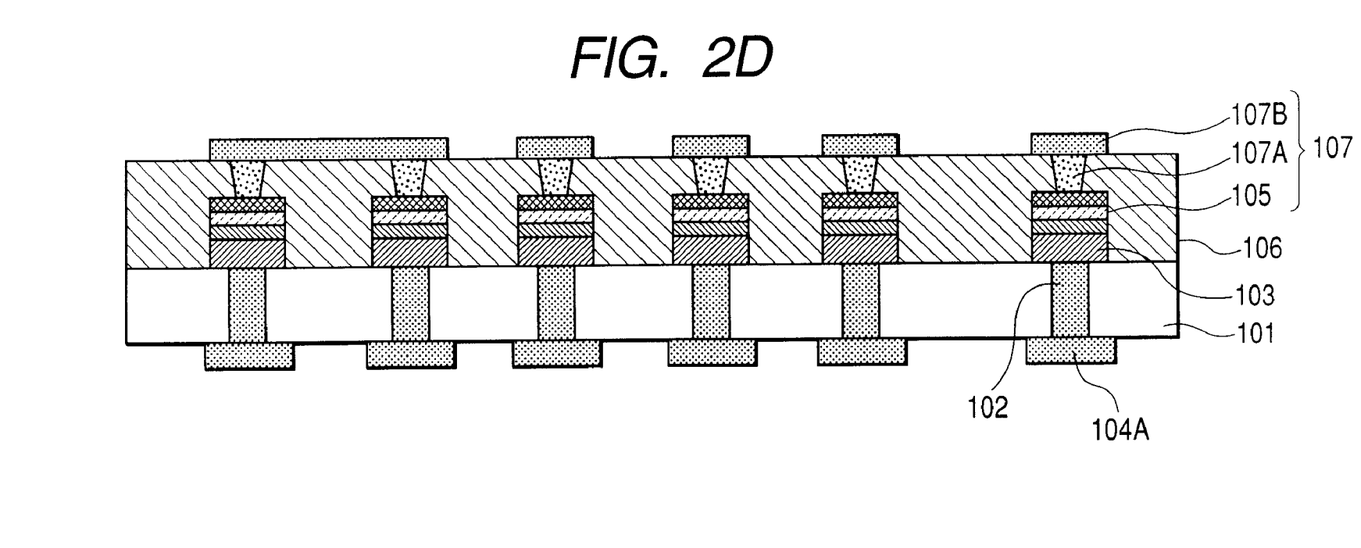
FIG. 2D is a diagram for showing a method for manufacturing a mounting substrate, according to an embodiment 1 (No. 4).

Next, in a step shown in FIG. 2D, via holes reaching the connecting layer 105 are formed in the insulating layer 106. Via plug 107A is formed in the via hole and pattern wiring 107B is formed on the insulating layer 106 by performing electrolytic plating method of Cu. while the conductive layer 104, the via plugs 102, the conductive patterns 103, and the connecting layer 105 are used as a power supply path. The pattern wiring 107B is formed on the insulating layer 106 so as to be connected to these via plugs 107A. Thus, wiring sections 107 including the connecting layer 105, the via plugs 107A and the pattern wiring 107B are formed.

As previously explained, the wiring sections 107 are formed by performing the electrolytic plating, while the conductive layer (power supply layer) 104 is used as the power supply path, the conductive layer 104 being formed over substantially the entire face of the supporting substrate 101 on a second side (namely, a side that is opposite to a side where semiconductor chip is mounted) of the supporting substrate 101. The conductive layer 104 becomes a common power supply path with respect to the plural wiring sections 107 which are individually formed, so that the very fine wiring sections 107 can be formed in a higher efficiency by the electrolytic plating.

Subsequently, the conductive layer 104 is patterned by etching by using a pattern mask, for example, so as to form a plurality of conductive patterns 104A. These conductive patterns 104A are respectively connected to the via plugs 102.

Figure 2E:
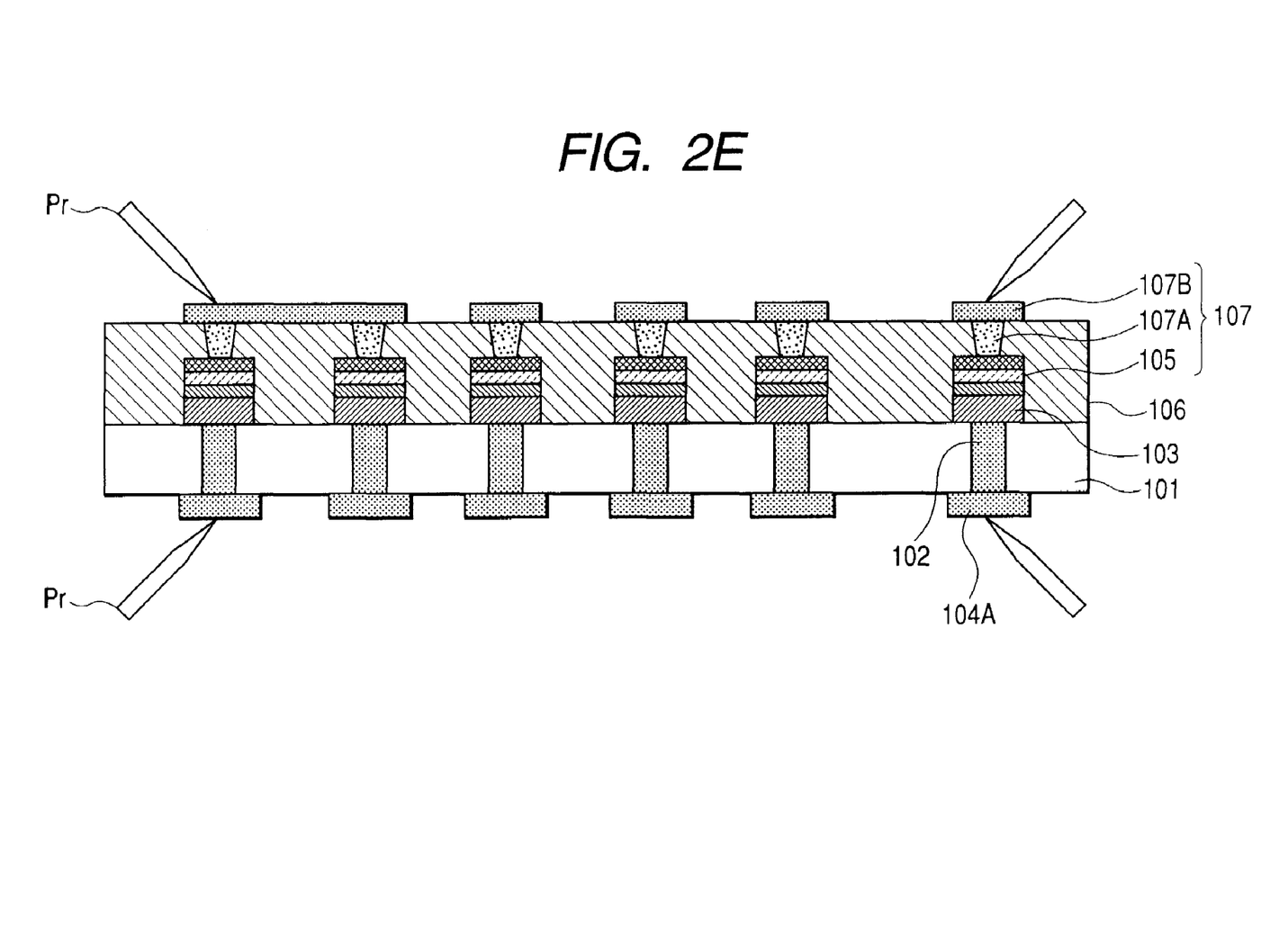
FIG. 2E is a diagram for showing a method for manufacturing a mounting substrate, according to an embodiment 1 (No. 5).

Next, in a step shown in FIG. 2E, probes Pr are made in contact with the conductive pattern 104A and the wiring section 107 (pattern wiring 107B), and a connection test (SOT) of the wiring patterns 107 is carried out by using the conductive patterns 104A. As explained above, since the conductive layer 104 is patterned, the connection test (SOT) can be carried out with respect to each of the wiring sections 107. For example, such a mounting substrate in which malfunction is detected in this step may be removed from a manufacturing line, or a predetermined wiring repairing process is carried out.

Figure 2F:
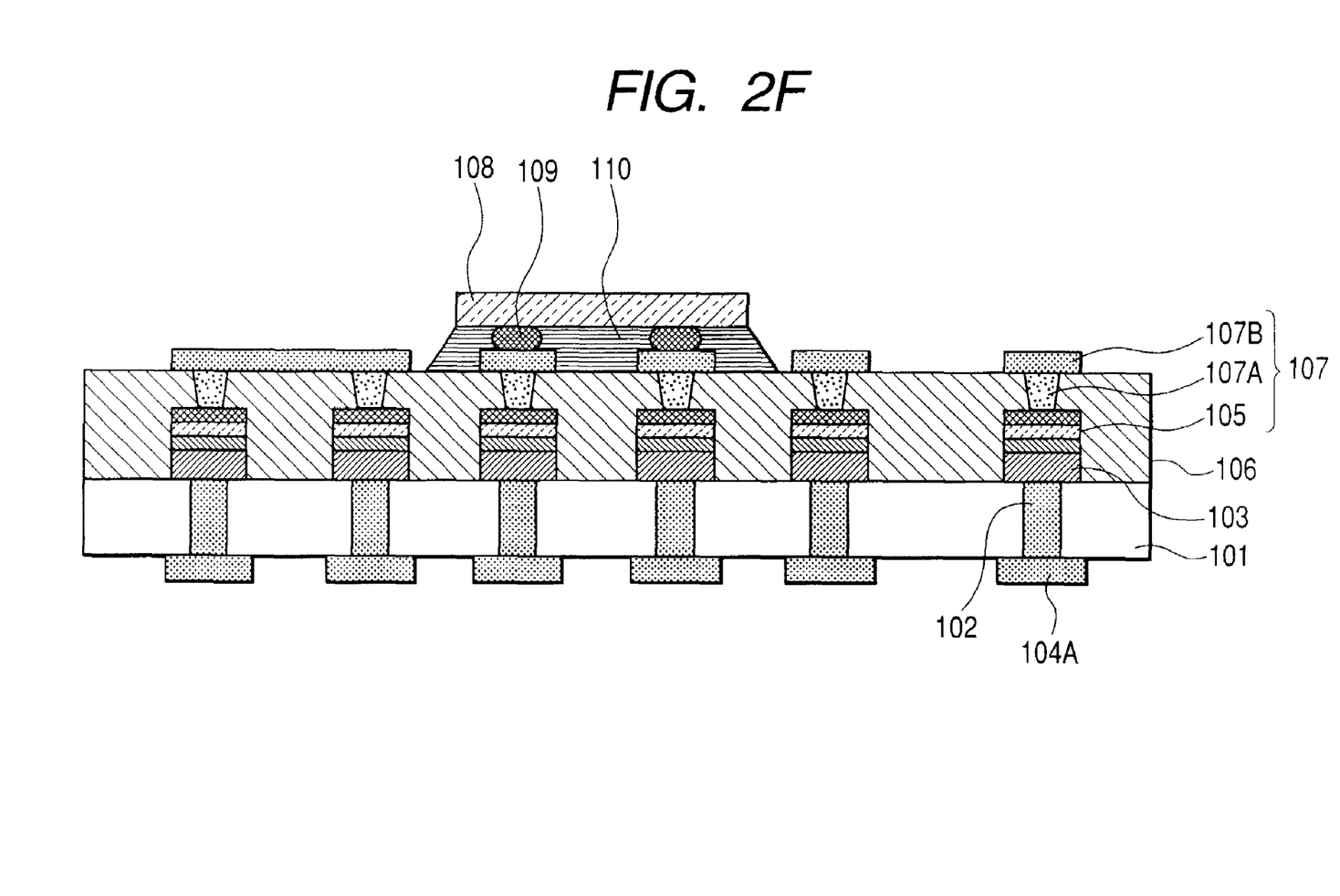
FIG. 2F is a diagram for showing a method for manufacturing a mounting substrate, according to an embodiment 1 (No. 6).

Next, in a step shown in FIG. 2F, a semiconductor chip 108 on which connecting sections 109 such as solder bumps and Au bumps have been formed is mounted on the wiring sections 107. In this case, the connecting sections 109 may be electrically connected to the pattern wiring 107B. Also, after the semiconductor chip 108 is mounted on the wiring sections 107, it is preferable that an under fill 110 may be filled between the semiconductor chip 108 and the insulating layer 106.

Figure 2G:
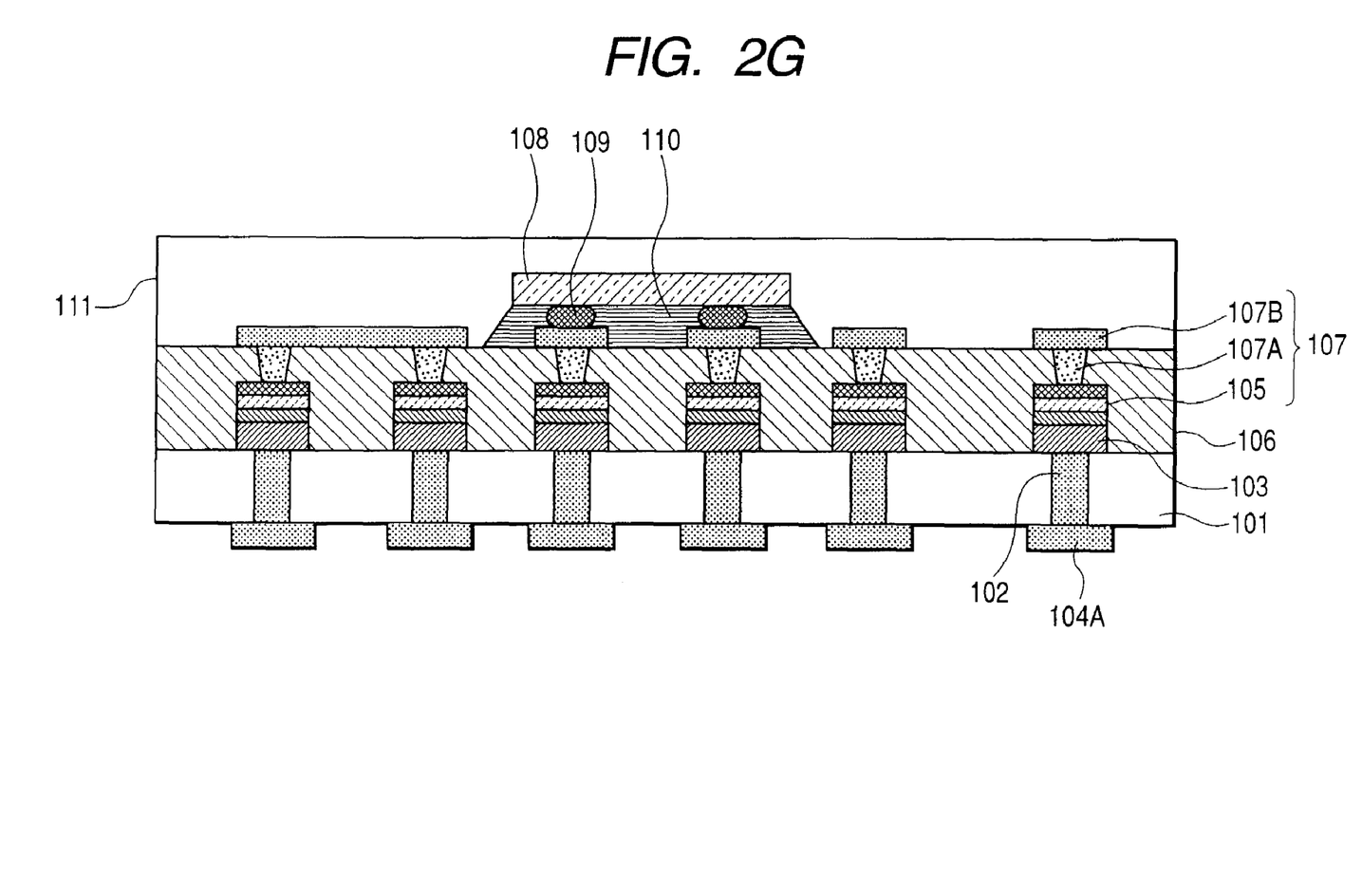
FIG. 2G is a diagram for showing a method for manufacturing a mounting substrate, according to an embodiment 1 (No. 7).

Next, in a step shown in FIG. 2G, an insulating layer 111 made of, for example, a build-up resin (either epoxy resin or polyimide resin, etc.) is formed on the insulating layer 106 in such a manner that this insulating layer 111 covers both the semiconductor chip 108 and the pattern wiring 107B.

Figure 2H:
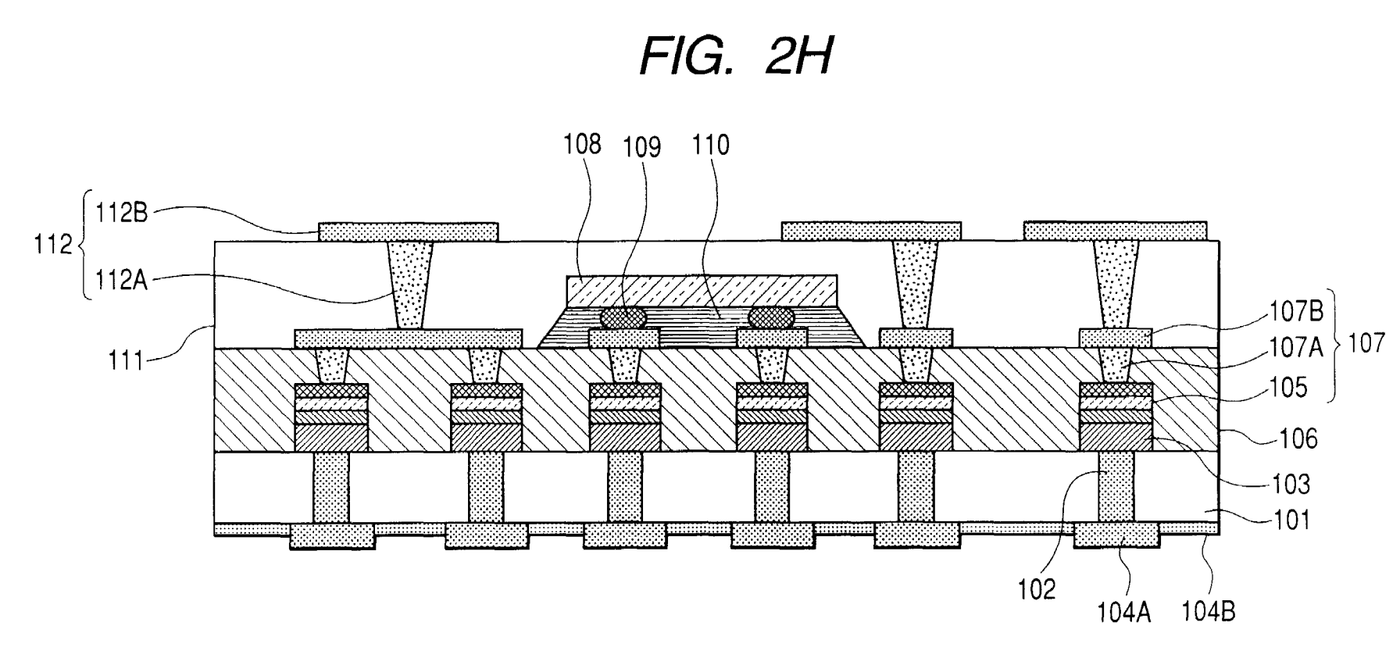
FIG. 2H is a diagram for showing a method for manufacturing a mounting substrate, according to an embodiment 1 (No. 8).

Next, in a step shown in FIG. 2H, a conductive layer (power supply layer) 104B made of, for example, Cu is formed on the second face of the supporting substrate 101 by performing, for instance, a sputtering method, an electroless plating method, or the like. The conductive layer 104B again electrically connects the conductive patterns 104A which are patterned to be separate. The conductive layer 104B serves as a power supply layer (power supply path) for forming wiring sections on an upper layer of the wiring section 107 by performing electrolytic plating.

Next, via holes reaching the wiring sections 107 (pattern wiring 107B) are formed in the insulating layer 111. Further, a via plug 112A is formed in the via hole and a pattern wiring 112B is formed on the insulating layer 111, by performing electrolytic plating of Cu, while using the conductive layer 104 (conductive patterns 104A and conductive layer 104B), the via plugs 102, the conductive patterns 103, and the wiring sections 107 as a power supply path. The pattern wiring 112B is formed on the insulating layer 111 so as to be connected to the via plug 112A. The wiring sections 112 including the via plugs 112A and the pattern wiring 112B are formed on the upper layer of the wiring sections 107.

As previously explained, after the semiconductor chip 108 is mounted, the conductive layer 104B is again formed on the supporting substrate 101. As a result, the wiring sections 112 can be effectively formed on the upper layer of the wiring sections 107 by performing the electrolytic plating.

Figure 2I:
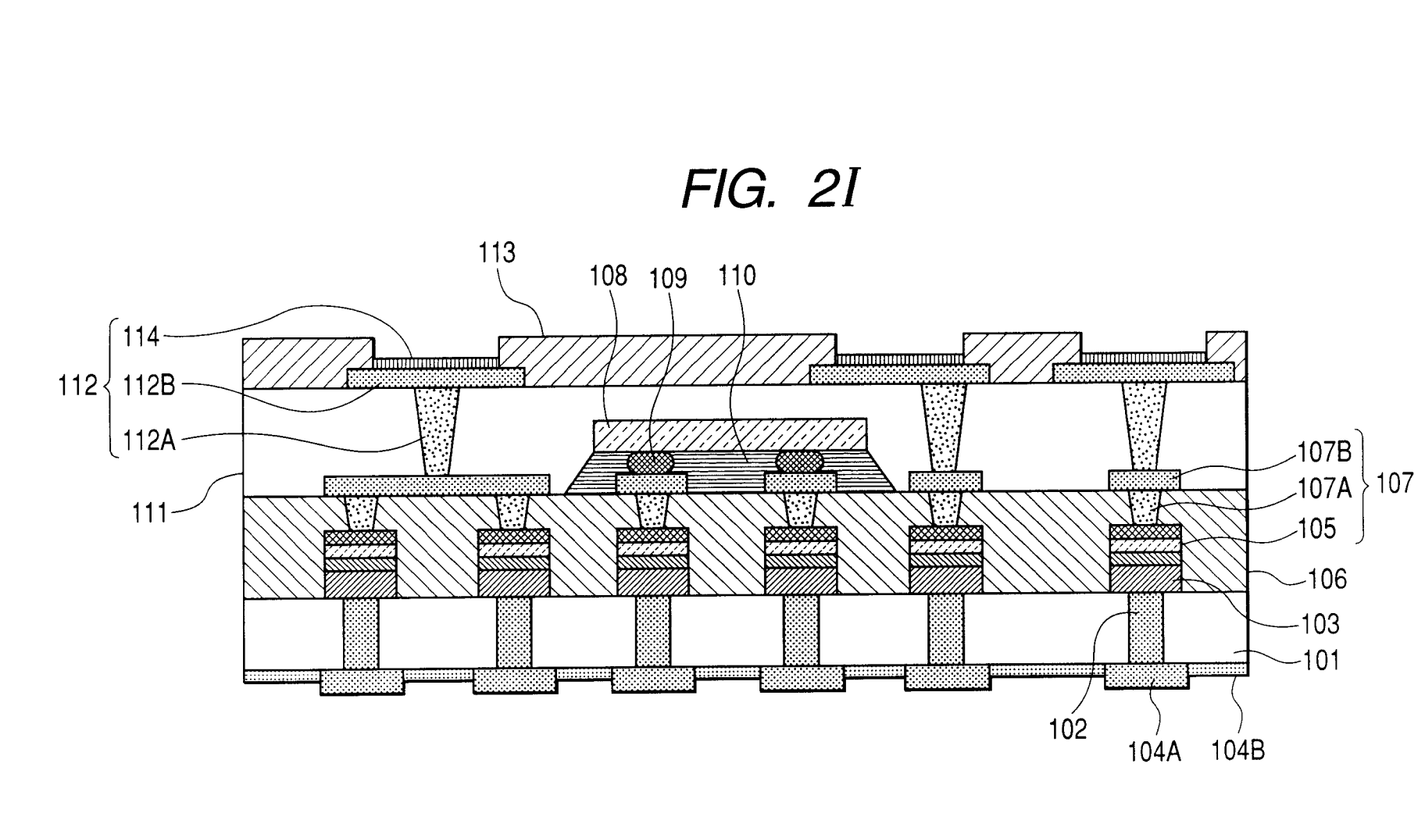
FIG. 2I is a diagram for showing a method for manufacturing a mounting substrate, according to an embodiment 1 (No. 9).

Next, in a step shown in FIG. 2I, a solder resist layer 113 having an opening portion is formed on the insulating layer 111, while a part of the pattern wiring 112B is exposed from the opening portion. Furthermore, a connecting layer 114 made of, for example, Ni/Au layer is formed on the pattern wiring 112B which is exposed from the solder resist layer 113 by performing electrolytic plating, while using the conductive layer 104B, the conductive patterns 104A, the via plugs 102, the conductive patterns 103, and the wiring sections 107 and 112 are used as a power supply path. In this case, the wiring sections 112 includes the connecting layer 114 in addition to the via plugs 112A and the pattern wiring 112B.

Figure 2J:
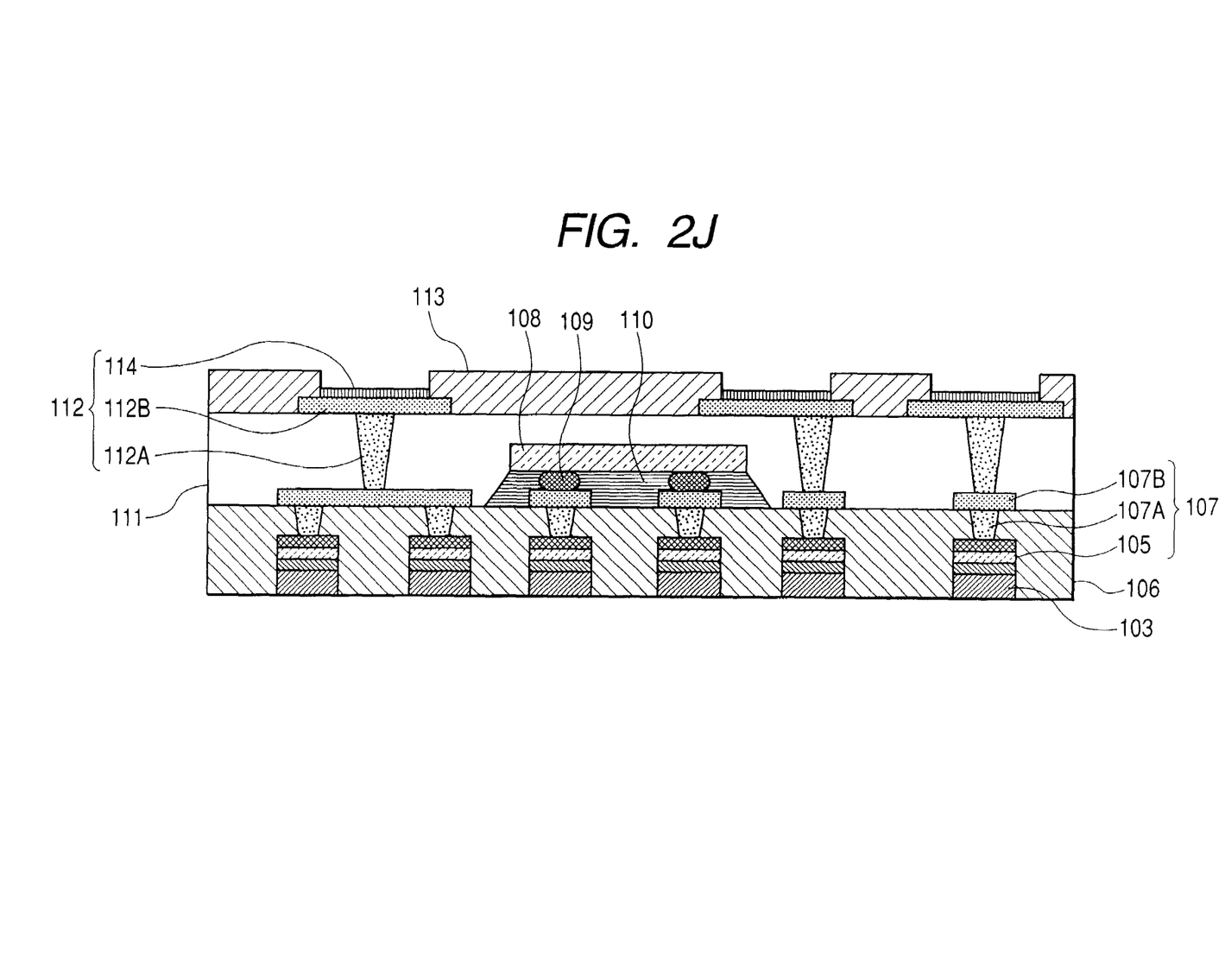
FIG. 2J is a diagram for showing a method for manufacturing a mounting substrate, according to an embodiment 1 (No. 10).

Next, in a step shown in FIG. 2J, the supporting substrate 101 in which the via plugs 102 are formed and on which the conductive patterns 104A and the conductive layer 104B are formed is removed by, for instance, grinding. Although the removing method for removing the supporting substrate 101 is not limited only to the grinding process, since a hardness of the supporting substrate 101 is different from a hardness of the insulating layer 106, the supporting substrate 101 can be easily removed by the grinding.

Also, since a mounting substrate is formed on the supporting substrate 101, degree of flatness of the mounting substrate may be held in good condition. Then, since the mounting substrate is removed in the subsequent step, such an effect that the mounting substrate can be made thin can be achieved.

Figure 2K:
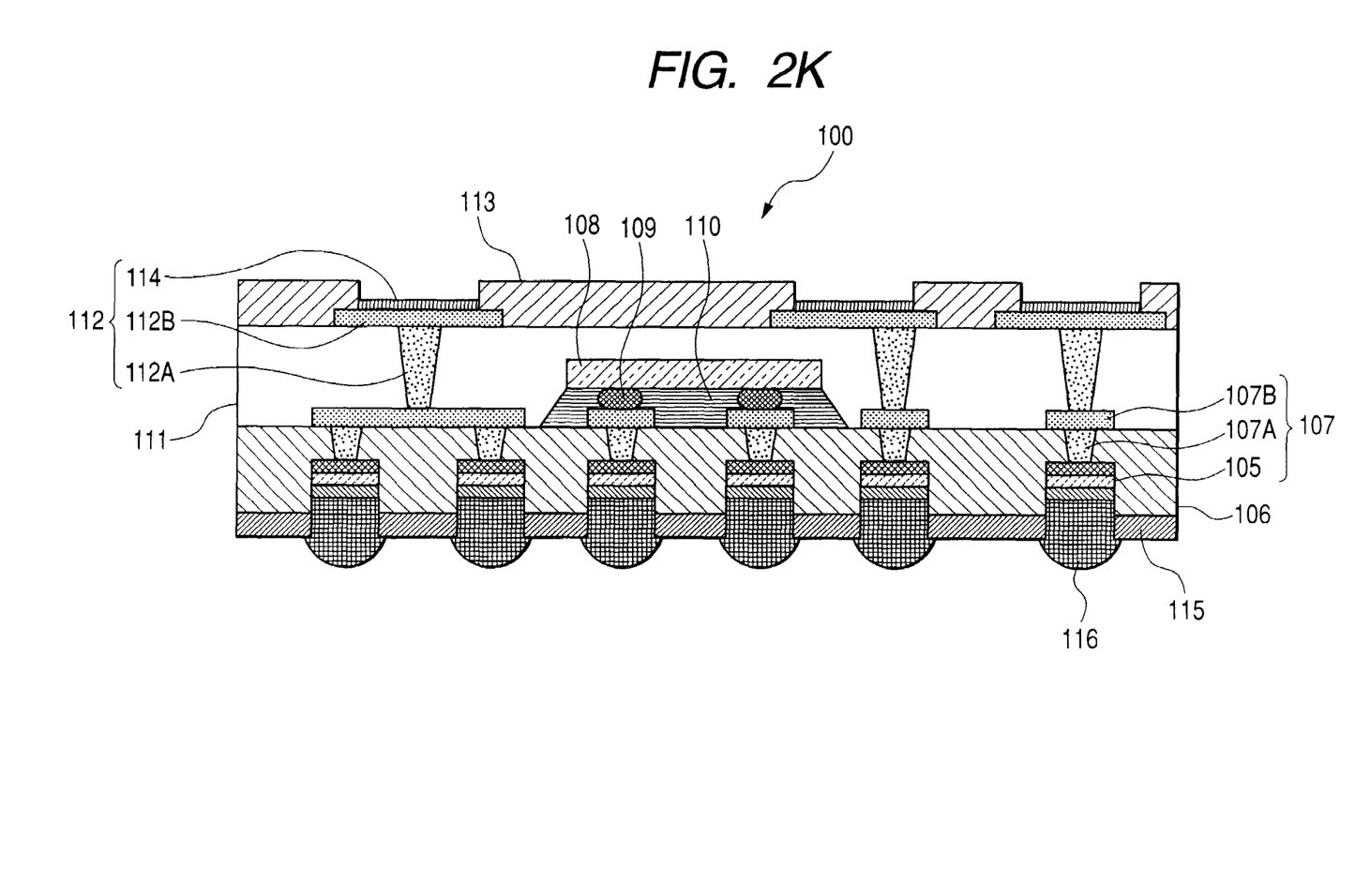
FIG. 2K is a diagram for showing a method for manufacturing a mounting substrate, according to an embodiment 1 (No. 11).

Next, in a step shown in FIG. 2K, the conductive patterns 103 which are exposed by removing the supporting substrate 101 is removed by etching. Subsequently, a solder resist layer 115 having an opening portion from which the connecting layer 105 is exposed is formed in such a manner that the solder resist layer 115 covers the insulating layer 106, and then, solder balls 116 are formed on the exposed connecting layer 105.

The mounting substrate 100 in which the semiconductor chip is embedded (mounted), according to the embodiment 1, can be manufactured in the above-described manner.

In the above derscribed manufacturing method, electric power is supplied from the conductive layer 104 formed on the second face (rear face) of the supporting substrate 101, so that the wiring sections 107 on which a semiconductor chip is mounted can be formed on the first face (front face) of the supporting substrate 101 by performing the electrolytic plating. Furthermore, the conductive layer 104 is patterned, so that the connection test (SOT) of the wiring sections 107 on which the semiconductor chip is mounted can be carried out before this semiconductor chip is mounted.

As a consequence, the reliability of the wiring sections 107 which are connected to the semiconductor chip may be increased, and also, the manufacturing yield when manufacturing the mounting substrate 100 becomes good. Further, a probability in which the manufacturing problem occurs can be suppressed such that the high cost semiconductor chip is mounted with respect to the wiring section 107 having the malfunction.

Also, after the semiconductor chip is mounted (namely, after step of FIG. 2F), as shown in FIG. 2H, the conductive layer (power supply layer) 104B is again formed on the rear face of the supporting substrate 101, so that the wiring sections 112 can be formed on the upper layer of the wiring sections 107 by performing the electrolytic plating. As previously explained, in the manufacturing method according to the embodiment 1, multilayer wirings having a required number of layers can be formed by the electrolytic plating.

Also, since the above-described conductive layer 104B is formed, another effect may be achieved, namely, such that it is possible to avoid that the mounted semiconductor chip is destroyed by, for example, static electricity.

Also, in the manufacturing method according to the embodiment 1, there is such a merit that damages given to insulating layers and devices may be reduced, as compared with a case where power supply layers and wiring sections formed by electrolytic plating are provided on the same face side of a supporting substrate.

For example, such a case that both a power supply layer and a wiring section are provided on the same face side implies the following case. That is, after the power supply layer is firstly formed by electroless plating method, the wiring section is formed on this power supply layer by electrolytic plating, and this power supply layer (electroless plated layer) is removed by etching. In this case, since the power supply layer formed on an insulating layer (for example, build-up layer and solder resist layer) has to be removed by etching, there are some cases that this insulating layer may be damaged. Also, after a semiconductor chip is mounted, there are some possibilities that the semiconductor chip may be damaged.

On the other hand, in the manufacturing method of the mounting substrate according to the embodiment 1, the power supply layer is formed on the rear face of the supporting substrate, and moreover, the supporting substrate is removed in the later step. As a result, there is such a merit that the damages given to the insulating layer where the wiring sections are formed and the mounted semiconductor chip can be reduced.

As a consequence, in such a case that an insulating layer (insulating layer 111) and a wiring section (wiring sections 112) are formed after the semiconductor chip is mounted, the method for manufacturing the mounting substrate according to the embodiment 1 preferable.

Alternatively, the above-explained structures of the wiring sections and the total layer number of insulating layers may be changed in various manners, for example, the below-mentioned manner, if necessary.

Embodiment 2

Figure 3:
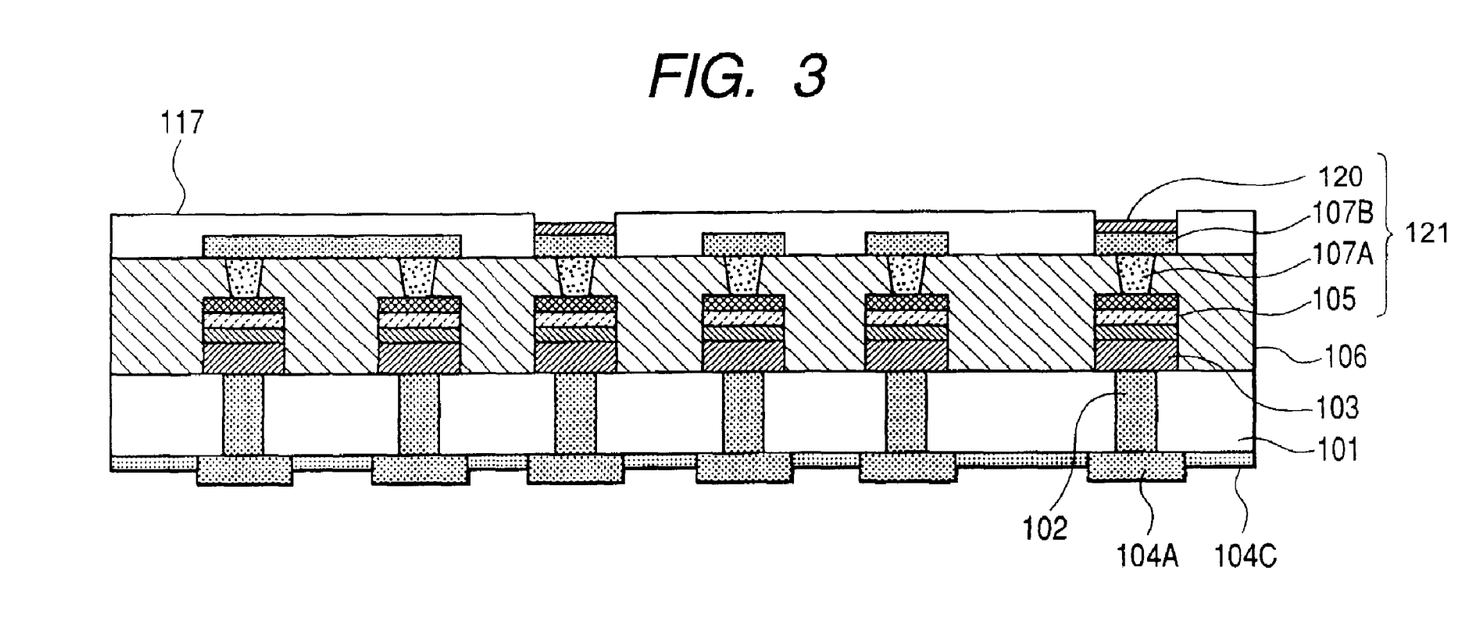
FIG. 3 is a diagram for showing a method for manufacturing a mounting substrate, according to an embodiment 2.

FIG. 3 is a diagram for showing a method of manufacturing a mounting substrate according to an embodiment 2 of the present invention. It should be noted that the same reference numerals previously explained in the above drawings will be used as those for denoting same structural elements as shown in the below-mentioned drawings.

In the manufacturing method of the mounting substrate according to this embodiment 2, first of all, up to a step shown in FIG. 3, the above-explained steps of FIG. 2A to FIG. 2E as to the embodiment 1 are carried out.

Next, in the step shown in FIG. 3, a conductive layer (power supply layer) 104C made of, for example, Cu is formed on the second face of the supporting substrate 101 by performing, for instance, as puttering method, an electroless plating method, or the like. The conductive layer 104C again electrically connects the conductive patterns 104A which are patterned to be separate.

Next, a solder resist layer 117 having an opening portion is formed on the insulating layer 106, while a part of the pattern wiring 107B is exposed from the opening portion. Furthermore, a layer 120 made of, for example, an Ni/Au layer is formed on the pattern wiring 107B which is exposed from the solder resist layer 117 by performing electrolytic plating, while using the conductive patterns 104A, the conductive layer 104C, the via plugs 102, and, the conductive patterns 103 as a power supply path. The wiring sections 121 including the connecting layer 105, the via plugs 107A, the pattern wiring 107B, and the connection layer 120 are formed in the above-explained manner.

Subsequently, the supporting substrate is removed by performing steps similar to the above-explained steps shown in FIG. 2J to FIG. 2K of the embodiment 1, so that a mounting substrate can be formed.

As described above, the above-explained structures of the wiring sections and the total layer number of insulating layers may be alternatively changed in various manners, if necessarily.

While the present invention has been described with respect to the preferred embodiments, the present invention is not limited only to the above-described specific embodiments, but may be modified, or changed without departing from the scope of claims for the patent.

Accordingly, the mounting substrate on which the semiconductor chip is mounted and in which the wiring section connected to the semiconductor chip has high reliability can be manufactured in the good yield.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method for manufacturing a mounting substrate on which a semiconductor chip is mounted, the method comprising:

(a) forming a wiring section by electrolytic plating on a first face of a supporting substrate which is made of an insulating material, by supplying electric power from a first power supply layer through a via plug piercing through the supporting substrate, the first power supply layer being formed on a second face of the supporting substrate;

(b) performing patterning on the first power supply layer so as to form a first conductive pattern which is connected to the wiring section through the via plug;

(c) performing a connection test of the wiring section by using the conductive pattern;

(d) mounting the semiconductor chip on the wiring section; and (e) removing the supporting substrate.

2. The method for manufacturing the mounting substrate as claimed in claim 1, further comprising:
   forming a second conductive pattern on the first face of the supporting substrate, the second conductive pattern and the via plug serving as a power supply path for electrolytic plating; and
   removing the second conductive pattern after removing the supporting substrate.

3. The method for manufacturing the mounting substrate as claimed in claim 1, further comprising:
   forming a second power supply layer on the second face of the supporting substrate after mounting the semiconductor chip; and
   forming an upper layer wiring section on the wiring section by electrolytic plating, by supplying electric power from the second power supply layer,
   wherein the supporting substrate is removed after forming the upper layer wiring section.

4. The method for manufacturing the mounting substrate as claimed in claim 2, further comprising:
   forming a second power supply layer on the second face of the supporting substrate after mounting the semiconductor chip; and
   forming an upper layer wiring section on the wiring section by electrolytic plating, by supplying electric power from the second power supply layer,
   wherein the supporting substrate is removed after forming the upper layer wiring section.

5. The method for manufacturing the mounting substrate as claimed in claim 3, further comprising:
   forming a first insulating layer on the first face; and
   forming a second insulating layer on the first insulating layer,
   wherein the wiring section is formed on the first insulating layer, and
   the upper layer wiring section is formed on the second insulating layer.

6. The method for manufacturing the mounting substrate as claimed in claim 4, further comprising:
   forming a first insulating layer on the first face; and
   forming a second insulating layer on the first insulating layer,
   wherein the wiring section is formed on the first insulating layer, and the upper layer wiring section is formed on the second insulating layer.

7. The method for manufacturing the mounting substrate as claimed in claim 1, wherein the supporting substrate is removed by grinding.

8. The method for manufacturing the mounting substrate as claimed in claim 1, wherein the steps (a) through (e) are sequentially performed.

* * * * *